United States Patent [19]

Marriott

[11] 4,082,998

[45] Apr. 4, 1978

[54] DUAL SLOPE INTEGRATION CIRCUIT

[75] Inventor: Joe E. Marriott, Loveland, Colo.

[73] Assignee: Hewlett-Packard Company, Palo Alto, Calif.

[21] Appl. No.: 777,297

[22] Filed: Mar. 14, 1977

Related U.S. Application Data

[63] Continuation of Ser. No. 591,266, Jun. 30, 1975, abandoned.

[51] Int. Cl.² ............... G01R 17/06; H03K 1/02; H03K 13/02
[52] U.S. Cl. ............... 324/99 D; 307/296 R; 324/111; 324/130; 340/347 NT; 340/347 CC
[58] Field of Search ............... 324/99 D, 99 R, 130, 324/111; 340/347 AD, 347 NT, 347 CC; 330/9; 328/127; 307/296

[56] References Cited

U.S. PATENT DOCUMENTS

| 3,105,230 | 9/1963 | MacIntyre | 324/130 |
| 3,895,376 | 7/1975 | Uchida | 340/347 NT |

Primary Examiner—Rudolph V. Rolinec
Assistant Examiner—Ernest F. Karlsen
Attorney, Agent, or Firm—Michael L. Sherrard

[57] ABSTRACT

A circuit for performing dual slope integration to provide a digital measurement of an input voltage of either positive or negative polarity employs a single source of reference potential in combination with a switchable resistive network as a source of reference current.

5 Claims, 3 Drawing Figures

DUAL SLOPE INTEGRATION CIRCUIT

REFERENCE TO FIRST APPLICATION

This application is a continuation of copending patent application Ser. No. 591,266, entitled DUAL SLOPE INTEGRATION CIRCUIT filed June 30, 1975, now abandoned, by Joe E. Marriott.

BACKGROUND AND SUMMARY OF THE INVENTION

This invention pertains generally to digital measurement of an unknown input voltage and more particularly to a simplified means to measure an input voltage of either polarity using dual slope integration.

Dual slope integration is a common technique used to perform an analog-to-digital conversion of an unknown input voltage. The technique basically involves establishing an equilibrium state in the measurement circuitry with no input applied, generally referred to as the auto-zeroing cycle; applying the unknown input voltage to an integrator for a fixed period of time, generally referred to as the signal-responsive cycle; and then digitally measuring the time required to return the integrator to a predetermined voltage level by application of a source of reference potential of opposite polarity to that of the input voltage, generally referred to as the reference cycle. In order to measure both positive and negative input voltages, it is generally necessary to have both a relatively positive and a relatively negative reference available during the reference cycle.

Dual slope integration circuits constructed according to the prior art have typically included either two separate sources of reference potential or have biased the signal at the input of the integrator so that it always has the same polarity regardless of the polarity of the input voltage. The latter technique requires a separate additional measurement to calculate a zero reference level and also requires a digital subtraction means such as up-down counters or an arithmetic logic unit to calculate the difference between the input voltage and the zero reference level.

Other known circuits measure input voltages of either positive or negative polarity by employing only one source of reference potential. This is accomplished by switching between zero volts and the reference potential at a fifty percent duty cycle rate to produce an average reference equal in value to one-half the reference potential. The value of this average reference is then altered by altering the switching duty cycle to either increase or decrease the average value of the reference, thus providing either a net positive reference or a net negative reference, respectively, as required for the measurement. Representative of these circuits is the LD110-LD111 Processor manufactured by Siliconix, Incorporated. This circuit does not comprise a dual slope integrator, but does rely on application of a known reference to an integrator to allow digital measurement of an analog signal. Circuits of this type are disadvantageous in that they require sophisticated logic circuitry to alter the reference switching duty cycle and to compensate for errors caused by finite switching times.

Yet another known circuit employing only one source of reference potential stores that reference on a capacitor. The charged capacitor is employed, by means of appropriate switching circuitry, as an opposite source of reference potential if required during a measurement. Such a circuit is used in the Data Precision Corporation Model 245 Digital Multimeter. These circuits are disadvantageous in that they require complicated analog switching techniques to reverse the polarity of the capacitor and to apply the stored voltage to the circuit when required.

In summary, all of the known digital measurement circuits involving integrating techniques are disadvantageous in that they require either two separate sources of reference potential, a single source of reference potential plus a switchable inverting amplifier, a single source of reference potential plus a capacitor and attendant complicated switching, or a single source of reference potential plus sophisticated logic curcuitry to perform digital subtraction or to alter a switching duty cycle.

Accordingly, it is the principal object of the present invention to provide a dual slope integration circuit for digitally measuring input voltages of either positive or negative polarity by employing a simple switchable resistive network connected to a single source of reference potential. Other and incidental objects of this invention will become apparent from a reading of this specification and an inspection of the accompanying drawings.

These objects are accomplished in accordance with the preferred embodiment of the invention by employing an input amplifier, an integrator, a sample and hold circuit, and a single polarity current source. During the aforementioned auto-zeroing cycle and signal-responsive cycle a positive reference current provided by the single polarity current source is exactly balanced by a negative reference current supplied from the sample and hold circuit. During the reference cycle, the polarity of the input voltage is sensed, and the positive reference current is accordingly altered by either increasing or decreasing it by a fixed amount, resulting in a net positive or net negative current flow into the integrator. Alteration of the positive reference current provided by the current source is effected by simply switching in an additional parallel resistor connected to a source of reference potential to increase the positive reference current, or by switching out the resistor originally connected to the source of reference potential to reduce the positive reference current. Both switched resistors are of equal value so that the reference current added in response to sensing one polarity equals the reference current subtracted in response to sensing the opposite polarity.

DESCRIPTION OF THE PREFERRED EMBODIMENT

Figure 1:
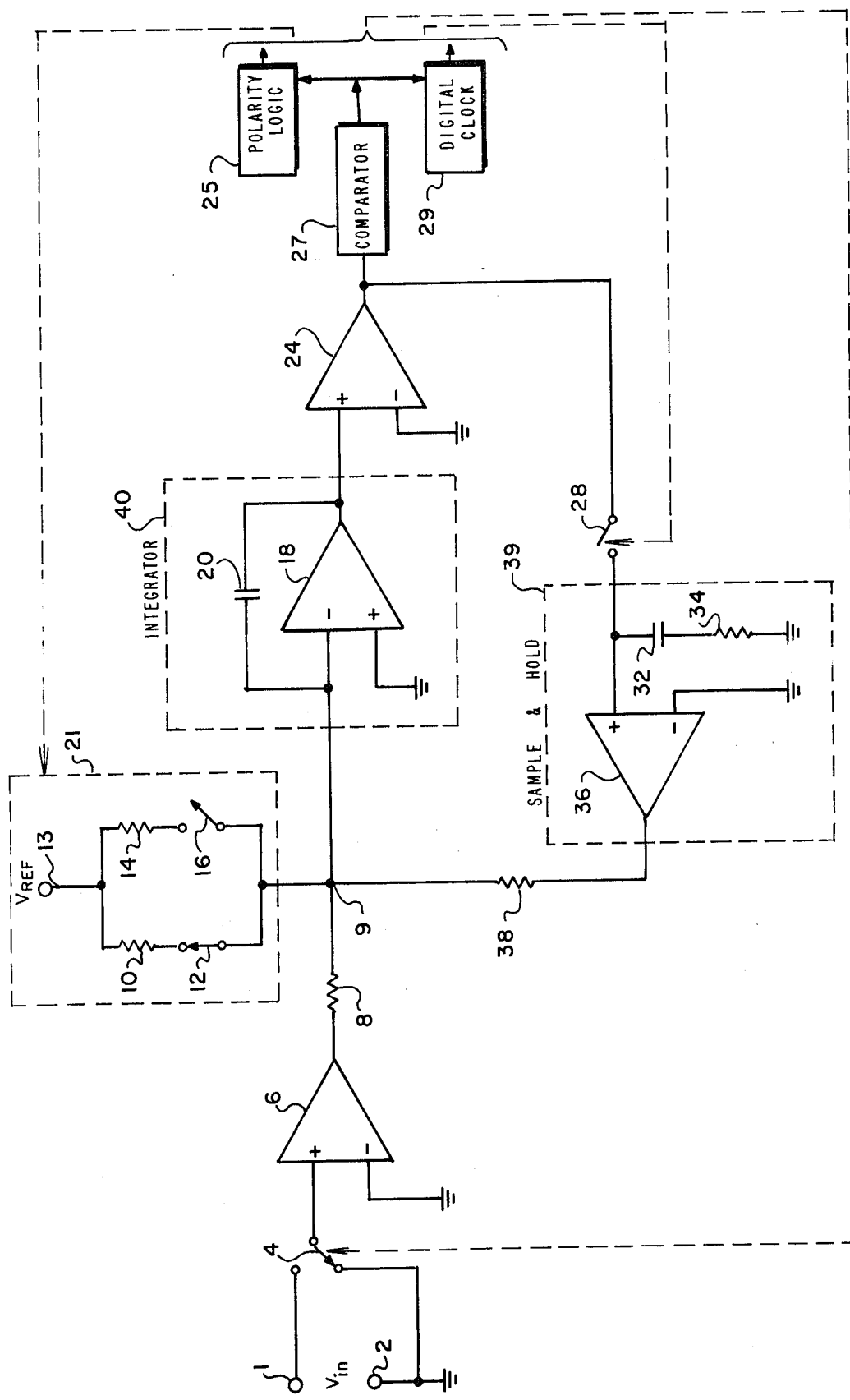
FIG. 1 is a detailed schematic diagram of a dual slope integration circuit in accordance with the preferred embodiment of this invention that employs a single source of reference potential and a switchable resistive network.

Referring now to FIG. 1, there is shown a circuit for performing dual slope integration to provide digital measurement of an input voltage applied between an input terminal 1 and a reference terminal 2 using only a single polarity step variable current source 21. This circuit may be employed to measure input voltages of either positive or negative polarity.

A switch 4, which may comprise, for example, a pair of junction field effect transistors with logically complimentary gate signals is operable in two operating modes. In a first operating mode switch 4 connects a zero reference voltage from terminal 2 to a noninverting input of an input amplifier 6. In a second operating mode switch 4 connects a voltage applied to input terminal 2 to the noninverting input of input amplifier 6. The output of the input amplifier 6 is connected through a resistor 8 to a summing junction 9. Thus the current applied to summing junction 9 through resistor 8 is a zero reference current or current responsive to the input voltage during operation in first and second operating modes respectively. Step variable current source 21 is also connected to summing junction 9. Step variable current source 21 consists of the parallel combination of a resistor 10 and a switch 12 and another resistor 14 and a switch 16 connected between a D.C. source of reference potential 13 and summing junction 9. Switches 12 and 16 may comprise, for example, junction field effect transistors. Resistors 10 and 14 are of equal resistance. If switches 12 and 16 are both open, a first current having a zero amplitude is supplied to the summing junction 9. If either switch 12 or 16 is closed, a second current is supplied, and if both switches 12 and 16 are closed, a third current, having twice the amplitude of the second current and having the same polarity, is supplied to summing junction 9. The output of a sample and hold circuit 39 is also connected to summing junction 9 through a resistor 38.

Summing junction 9 is further connected to the input of an integrator 40. The integrator employs the well-known combination of an operational amplifier 18 and a capacitor 20. The output of the integrator 40 is connected to the input of a noninverting amplifier 24. The output of amplifier 24 is in turn connected to a comparator 27. Comparator 27 senses the output of amplifier 24 and generates a logic signal that is used by a polarity logic block 25 to determine the polarity of the input voltage. Comparator 27 also detects the point at which the output of the integrator reaches a predetermined level, and generates a logic signal that serves to stop a clock 29 employed in the dual slope integration procedure. The output of amplifier 24 is further connected through a switch 28 to the input of sample and hold circuit 39 for autozeroing purposes, as described in detail hereinafter.

A measurement sequence comprises three basic operations, referred to herein as the auto-zeroing cycle, a signal-responsive cycle, and a reference cycle. During the auto-zeroing cycle, the zero reference at reference terminal 2 is connected to input amplifier 6. At the same time, switch 28 is closed, thereby connecting the output of amplifier 24 to the sample and hold circuit 40 and placing the sample and hold circuit in the sample mode of operation. Any voltage at the output of amplifier 24 thus appears across a capacitor 32, which is connected through a resistor 34 to the zero reference, and at the input to a buffer amplifier 36 within the sample and hold circuit 39. Switch 12 is closed to allow D.C. current to flow in resistor 10. Switch 16 is open. Sample and hold circuit 39 generates D.C. current flow that will offset current flowing in resistor 10 as well as those leakage currents associated with amplifiers 6 and 18. After the currents at summing junction 9 settle to their final values, no current flows in capacitor 20, and hence no integration occurs in the integrator 40.

At the start of the signal-responsive cycle switch 28 is opened, placing the sample and hold circuit in the hold mode of operation by preventing further changes in the voltage on capacitor 32 at the input of sample and hold circuit 39. Current flowing through resistor 38 now remains fixed and is linearly related to the voltage held by the sample and hold circuit 39. Switch 12 remains closed to allow D.C. current to continue to flow in resistor 10, and switch 16 remains open.

Figure 2:
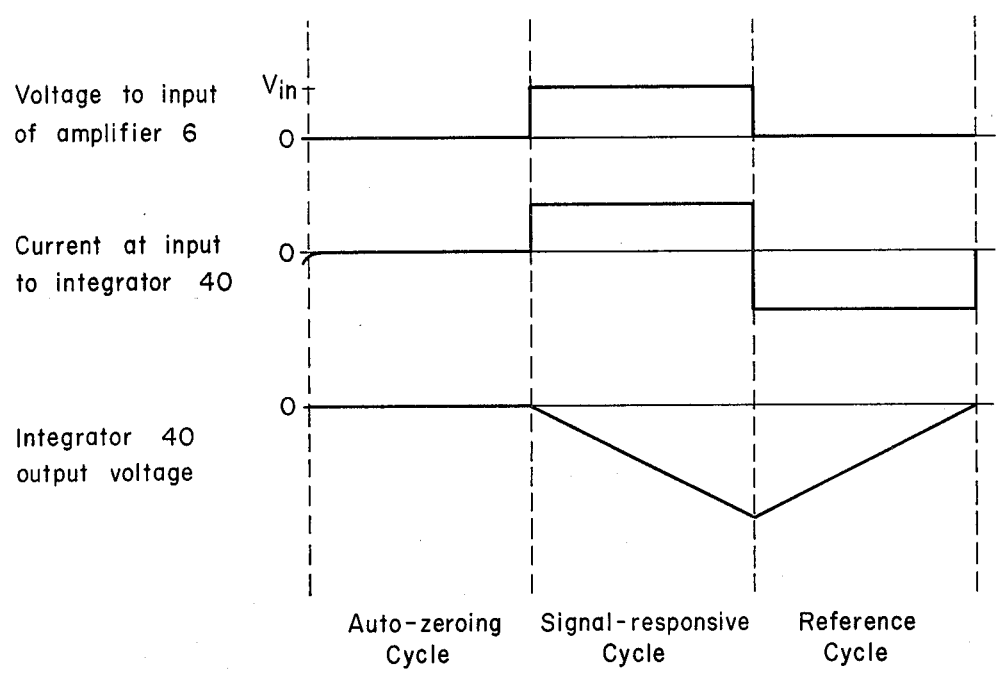
FIG. 2 is a diagram showing representative waveforms of signals appearing at selected points in the dual slope integration circuit of FIG. 1 when a positive input voltage is applied.
Figure 3:
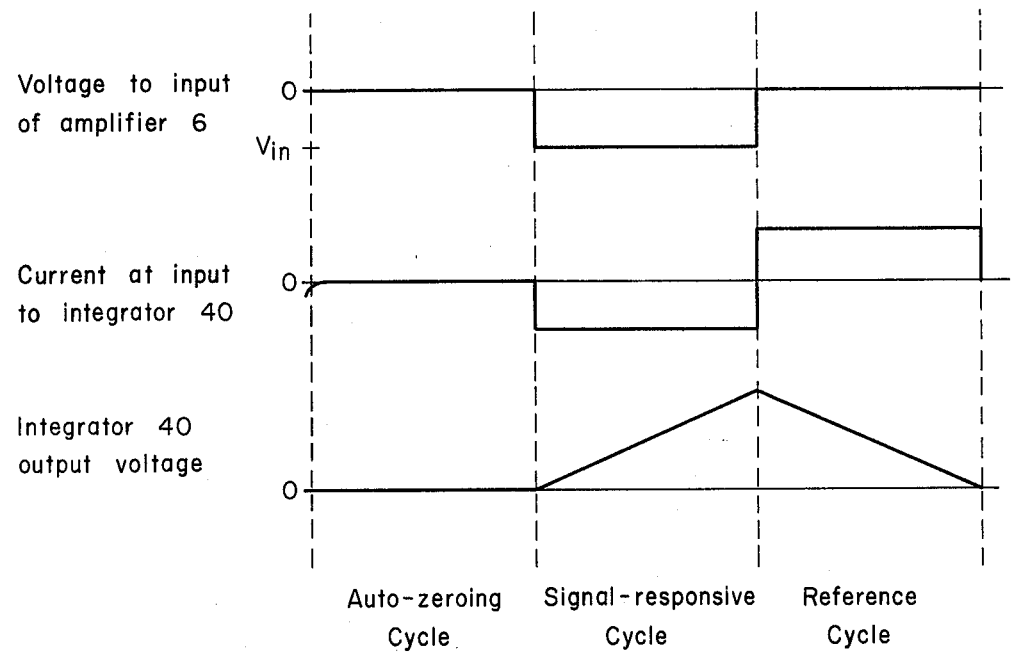
FIG. 3 is a diagram showing representative waveforms of signals appearing at selected points in the dual slope integration circuit of FIG. 1 when a negative input voltage is applied.

Switch 4 is now actuated to apply the input voltage connected at input terminal 1 to input amplifier 6. A current linearly related to the input voltage thus flows in resistor 8. This current in turn flows into integrator 40 and produces an output voltage integrated over time, as shown in the signal-responsive cycle of FIGS. 2 and 3. As in most dual slope integration techniques, the input voltage is applied for a fixed period of time and generates an integrated output signal at the end of this period that is proportional to the magnitude of the input voltage. At the end of the signal-responsive cycle, the polarity of the input signal may be sensed, for example, by the comparator 27 which transmits a logic signal to the polarity logic block 25, in preparation for the rundown sequence. In order to prevent integration beyond the selected period of time for the signal-responsive cycle, switch 4 is again actuated to connect the zero reference at reference terminal 2 to the input of amplifier 6.

During the reference cycle, the magnitude of the input voltage is measured by applying a known D.C. reference current of the opposite polarity to that current previously caused to flow in resistor 8 by the input voltage, to the integrator 40 and by then calculating the time required for the integrator output to attain a predetermined level, typically equal to the offset voltage appearing at the output of amplifier 24. This time will be proportional to the magnitude of the applied input voltage and is converted to a digital indication of the magnitude of the input voltage by enabling a digital clock 29 for the duration of the reference cycle. The clock is stopped by a logic signal from comparator 27 when the comparator senses that the output of the integrator has reached the predetermined level. Amplifier 24 has a large gain, X4000 for example, to provide a rapidly changing voltage during the reference cycle to allow a more precise indication of when the predetermined level is reached.

The known D.C. reference current of opposite polarity employed in the aformentioned reference cycle is supplied, in accordance with the preferred embodiment of the invention, by the step variable current source 21 in cooperation with the sample and hold circuit 29. The polarity of the input voltage, sensed at the end of the signal-responsive cycle, determines the required polarity of the D.C. reference current required for the reference cycle. If the input voltage is sensed to be positive, a negative D.C. reference current must be caused to flow at the input to the integrator 40 during the reference cycle. On the other hand, if the input voltage is senced to be negative, a positive D.C. reference current is required at the input of the integrator 40 during the reference cycle.

Since switch 28 remains open during the reference cycle, the current flowing in resistor 38 remains unchanged from that current established during the auto-zeroing cycle and maintained during the signal-responsive cycle. In the event the input voltage is sensed to be negative, a positive D.C. reference current is supplied to the integrator 40. This is accomplished by keeping switch 12 closed, as it was during the signal-responsive cycle, and by additionally closing switch 16. The current flowing in resistor 10 continues to balance the current in resistor 38 that is generated by the voltage held by the sample and hold circuit 39. The additional current flowing into summing junction 9 through resistor 14 as a result of closing switch 16 then causes a positive current to flow into the input of integrator 40, as shown in the reference cycle in FIG. 3. This positive current flowing at the input of integrator 40 is equal to the current now flowing in resistor 14.

In the event the input voltage is sensed to be positive, a negative D.C. reference current is supplied to the integrator 40. This is accomplished by keeping switch 16 open, as it was during the signal-responsive cycle, and by additionally opening switch 12. Removal of the current previously flowing into summing junction 9 through resistor 10 and switch 12 causes a negative current to flow at the input to the integrator 40, as shown in the reference cycle in FIG. 2, to balance the current in resistor 38 that is generated by the voltage held by sample and hold circuit 39. The magnitude of this negative current flowing at the input of integrator 40 will equal the magnitude of the current that flowed in resistor 10 before switch 12 was opened.

I claim:

1. A dual polarity current source and biasing circuit comprising:

circuit means having an input for producing an output signal responsive to a net current applied to the input thereof;

single polarity step variable current source means coupled to the input of said circuit means for supplying an output current to the input of said circuit means having an amplitude selectable from first, second and third amplitudes where the second amplitude is non-zero, the first amplitude is less than the second amplitude, and the third amplitude is greater than the second amplitude;

sample holding means coupled to said circuit means for selectively sampling the output signal therefrom when the second amplitude output current is selected from said source means and for concurrently and subsequently applying to the input of said circuit means a feedback current responsive to the output signal selectively sampled which alters the output signal produced by said circuit means to substantially equal a reference value during the selective sampling.

2. A circuit as in claim 1 wherein said source means comprises:

a single source of reference voltage; and a plurality of resistors switchably connectable between the source of reference voltage and the input of said circuit means of supplying thereto the output current having the first, second and third amplitudes.

3. A dual slope integration circuit for operating on an input voltage of either positive or negative polarity, the circuit comprising:

input means having an input for receiving the input signal and operable in first and second operating modes for selectively producing either a reference output current or an output current responsive to the input signal during operation in the first and second operating modes, respectively:

single polarity step variable current source means for controllably supplying an output current having one non-zero amplitude during initial operating of the input means in the first and second operating modes and having an amplitude which is selectively less than or greater than the one non-zero amplitude during subsequent operation of the input amplifier means in the first operating mode;

current integration means having an input coupled to receive the output currents from said input means and from said source means for producing an output signal representative of the time integral of currents applied to the input thereof;

sample holding means coupled to said current integration means for selectively sampling the output signal produced therefrom during operation of said input means in the first operating mode and for concurrently and subsequently applying to the input of said current integration means a feedback current in response to the output signal selectively sampled which alters the output signal produced by said current integration means to substantially equal a reference value during the selective sampling;

logic means cooperating with said current integration means, cooperating with said input amplifier means, cooperating with said source means and cooperating with said sample holding means for controlling the operations thereof in first and second operating modes and for establishing a relationship between the durations of such modes which is representative of the value of the input signal.

4. A circuit as in claim 3 wherein said source means comprises:

means for applying a single source of reference voltage; and a plurality or resistors switchably connectable between the source of reference voltage and the input of said current integration means for supplying thereto the output current having the first, second and third amplitudes.

5. The method of measuring an applied voltage of either polarity using dual-slope integration which establishes a time relationship between equal time integrals produced during a signal-responsive cycle and a reference cycle, the method comprising the steps, performed in selected sequence of:

combining a compensating current with a single polarity first reference current which is initially non-zero and adjusting the compensating current to produce a first resultant net current which is substantially zero during an auto-zeroing cycle;

establishing a current representative of the applied signal;

combining the current representative of the applied signal, the first reference current, and the compensating current to produce a signal-responsive net current;

integrating the time integral of the signal-responsive net current during a signal-responsive cycle;
determining the polarity of the applied signal;
altering the magnitude of the first reference current by a predetermined amount in response to the determined polarity;
combining the altered first reference current and the compensating current to produce a reference net current; and
integrating the time integral of the reference net current during a reference cycle.

* * * * *

UNITED STATES PATENT AND TRADEMARK OFFICE
CERTIFICATE OF CORRECTION

PATENT NO. : 4,082,998

DATED : April 4, 1978

INVENTOR(S) : Joe E. Marriott

It is certified that error appears in the above-identified patent and that said Letters Patent are hereby corrected as shown below:

Column 5, line 66, cancel "of" (second occurrence) and substitute -- for --

Signed and Sealed this

Eighth Day of January 1980

[SEAL]

Attest:

SIDNEY A. DIAMOND

Attesting Officer     Commissioner of Patents and Trademarks